(12) United States Patent
Kang et al.

(10) Patent No.: US 8,975,999 B2
(45) Date of Patent: Mar. 10, 2015

(54) TRANSFORMER USING SYMMETRICAL PRINTING PATTERN

(75) Inventors: Byung Joo Kang, Seoul (KR); Sung Hun Ahn, Seoul (KR); Ho Yong Hwang, Gyeongsangnam-do (KR); Chang Kun Park, Gyeonggi-do (KR)

(73) Assignee: Soongsil University Research Consortium Techno-Park, Seoul (KR)

( * ) Notice: Subject to any disclaimer, the term of this patent is extended or adjusted under 35 U.S.C. 154(b) by 0 days.

(21) Appl. No.: 14/342,788

(22) PCT Filed: Nov. 7, 2011

(86) PCT No.: PCT/KR2011/008408
§ 371 (c)(1),
(2), (4) Date: Mar. 5, 2014

(87) PCT Pub. No.: WO2013/035933
PCT Pub. Date: Mar. 14, 2013

(65) Prior Publication Data
US 2014/0197918 A1     Jul. 17, 2014

(30) Foreign Application Priority Data
Sep. 5, 2011  (KR) .......... 10-2011-0089617

(51) Int. Cl.
| H01F 5/00 | (2006.01) |
| H01F 27/28 | (2006.01) |
| H05K 1/16 | (2006.01) |
| H05K 3/22 | (2006.01) |

(52) U.S. Cl.
CPC ........... *H01F 27/2804* (2013.01); *H05K 1/165* (2013.01); *H05K 3/222* (2013.01); *H05K 2203/049* (2013.01); *H01F 2027/2814* (2013.01)
USPC .......................................... 336/200; 336/232

(58) Field of Classification Search
USPC .................................................. 336/200, 232
See application file for complete search history.

(56) References Cited

U.S. PATENT DOCUMENTS

| 6,586,309 | B1 * | 7/2003 | Yeo et al. .............. 438/381 |
| 2007/0128821 | A1 * | 6/2007 | Lee et al. .............. 438/381 |

FOREIGN PATENT DOCUMENTS

| JP | 01-101613 A | 4/1989 |
| JP | 06-053045 A | 2/1994 |
| JP | 2002-367830 A | 12/2002 |
| JP | 2009-212265 A | 9/2009 |

\* cited by examiner

*Primary Examiner* — Tsz Chan
(74) *Attorney, Agent, or Firm* — Revolution IP, PLLC

(57) ABSTRACT

Disclosed is a transformer using a symmetrical printing pattern which includes: a substrate; a plurality of first printing lines printed at predetermined distances on the substrate; a plurality of second printing lines printed at predetermined distances on the substrate; first bonding wires connecting the first printing lines; and second bonding wires connecting the second printing lines, in which the first printing lines and the second printing lines are printed in a symmetrical printing pattern, respectively, on the substrate, and the first bonding wires and the second bonding wires are formed symmetrically, respectively.

8 Claims, 3 Drawing Sheets

TRANSFORMER USING SYMMETRICAL PRINTING PATTERN

CROSS REFERENCE TO PRIOR APPLICATIONS

This application is a National Stage Application of PCT International Patent Application No. PCT/KR2011/008408 filed on Nov. 7, 2011, under 35 U.S.C. §371, which claims priority to Korean Patent Application No. 10-2011-0089617 filed on Sep. 5, 2011, which are all hereby incorporated by reference in their entirety.

TECHNICAL FIELD

The present invention relates to a transformer, and more particularly to a technology of implementing a transformer, using a pattern of metal wires printed on a substrate and bond wires.

BACKGROUND ART

Recently, digital integrated circuit technology has been rapidly developed. In particular, integration with the smallest cost is important for memories due to intense price competition. Digital integrated circuit devices such as memories use bonding wires for connection with other circuits. When there is a differential amplifier in integrated circuits, a transformer is required to convert differential output signals into a common mode output signals. As a method of implementing a transformer in the existing integrated circuits, a method of implementing a transformer itself as a transformer device in an integrated circuit or a method of implementing a transformer device outside an integrated circuit and connecting them has been developed.

First, when a transformer in implemented in an integrated circuit, it should be formed on a plane for the features of the integrated circuit, such that the transformer or an inductor occupies a large area in the integrated circuit. Further, the parasitic inductance is very large due to the thickness and length of the metal wire forming the transformer, so a lot of power is consumed when a current is induced in the transformer. Further, when the substrate where the integrated circuit is placed is made of silicon, there is a problem in that current leaks to the silicon substrate due to a current called an eddy current generated due to the material.

When a transformer is implemented outside an integrated circuit, the other device except for the transformer may be integrated and the transformer implemented in the type of SMD. However, an integrated circuit with components except for a transformer integrated and an SMD type of transformer are required to complete a high-frequency circuit. There is a problem, however, in that since steps for completing a high-frequency circuit are further added, the manufacturing cost increases. Further, since the high-frequency circuit is completed by the integrated circuit and an SMD for a transformer, there is a problem in that the entire size increases.

FIG. 1 is a view illustrating the configuration of a transformer using printing lines in the related art. Referring to FIG. 1, the transformer using printing lines includes a substrate 100, first printing lines 110, second printing lines 120, first bonding wires 130, and second bonding wires 140. Accordingly, the printing lines 110 and 120 and the bonding wires 130 and 140 function as a primary coil or a secondary coil of the transformer. In the existing transformers using printing lines, orthogonal printing lines were connected to bonding wires to increase the coil of the transformers. However, when the integrated circuit connected with the transformer is a symmetrical device, there is a problem in that efficiency reduces because the primary coils 110 and 130 and the secondary coils 120 and 140 of the transformer are not symmetric. Further, since all of the primary input/output electrodes $1^{st}_{in}$ and $1^{st}_{out}$ and the secondary input/output electrodes $2^{nd}_{in}$ and $2^{nd}_{out}$ are far way from each other, there is a problem in that additional printing lines or bonding wires are required for connection with a symmetrical integrated circuit, so the cost increases.

DISCLOSURE

Technical Problem

The present invention has been made in an effort to provide a transformer using a symmetrical printing pattern which implements a transformer that is connected to a symmetrical integrated circuit, using a symmetrical printing pattern.

Technical Solution

A transformer using a symmetrical printing pattern according to an embodiment of the present invention includes: a substrate; a plurality of first printing lines printed at predetermined distances on the substrate; a plurality of second printing lines printed at predetermined distances on the substrate; first bonding wires connecting the first printing lines; and second bonding wires connecting the second printing lines, in which the first printing lines and the second printing lines are printed in a symmetrical printing pattern, respectively, on the substrate, and the first bonding wires and the second bonding wires are formed symmetrically, respectively. The first printing lines and the first bonding wires may form a primary coil of the transformer, and the second printing lines and the second bonding wires may form a secondary coil of the transformer.

Further, the first printing lines and the second printing lines may be alternately printed at predetermined distances on the substrate.

Further, the first printing line and the second printing line each may include coil printing lines and a connection printing line.

Further, the coil printing lines may be printed in the shape of '— —' or '/ \' on the substrate.

Further, the connection printing line may be printed in the same length and in the same direction as the coil printing lines on the substrate.

Further, the connection printing line may be printed shorter than the coil printing lines on the substrate.

Further, the connection printing line may be printed longer than the coil printing lines on the substrate.

Further, the connection printing line may be printed in a loop on the substrate.

Advantageous Effects

According to a transformer using a symmetrical printing pattern of the present invention, since a transformer that is connected to a symmetrical integrated circuit is implemented, using a symmetrical printing pattern, it is possible to prevent deterioration of performance of a symmetrical device that is connected with the transformer and it is also possible to reduce the cost for connecting additional printing lines or bonding wires by concentrating the positions of the input/output terminals.

BEST MODE

Hereinafter, embodiments of the present invention are described with reference to the accompanying drawings. The terms used herein are terms selected in consideration of the functions in the embodiments and their meanings may depend on the intention of users and workers or precedents. Therefore, the meanings of the terms used in the following embodiments follow the definitions, if defined in detail herein, or should be construed as the meanings that those skilled in the art know, if not defined in detail.

Figure 2:
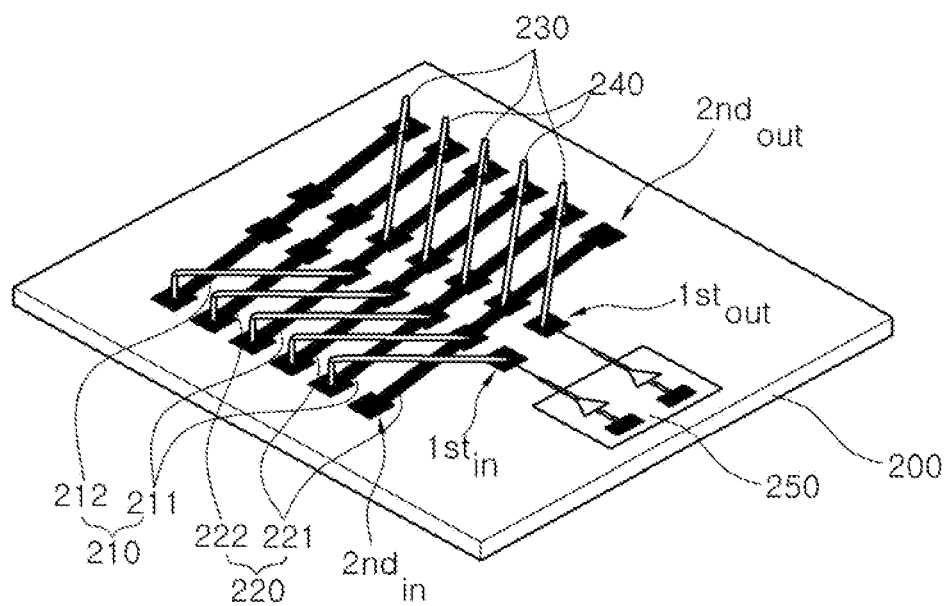
FIG. 2 is a view illustrating the configuration of a transformer using a symmetrical printing pattern according to an embodiment of the present invention.

FIG. 2 is a view illustrating the configuration of a transformer using a symmetrical printing pattern according to an embodiment of the present invention.

Referring to FIG. 2, a transformer using a symmetrical printing pattern includes a substrate 200, first printing lines 210, second printing lines 220, first bonding wires 230, and second bonding wires 240. The substrate 200, a kind of PCBs (Printed Circuit Board), is printed with a plurality of signal lines and mounted with a plurality of wireless integrated circuits. The first printing lines 210 and the second printing lines 220 are signal lines printed on the substrate 200 and formed by printing high conductive material such as copper (Cu), silver (Ag), or white gold (Pt). The first printing lines 210 are a portion of the primary coil of the transformer and the secondary printing lines 220 are a portion of the secondary coil of the transformer. In this case, the first printing lines 210 and the second printing lines 220 are each composed of a plurality of printing lines spaced from each other without crossing.

Figure 1:
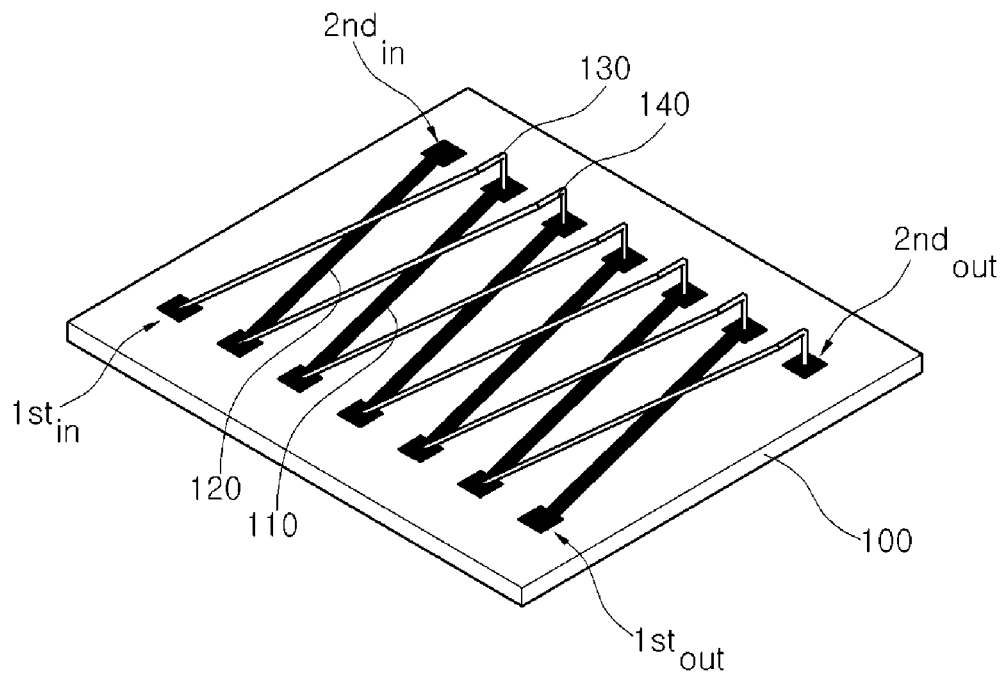
FIG. 1 is a view illustrating the configuration of a transformer using printing lines in the related art.

The first printing lines 210 and the second printing lines 220 are printed in a symmetrical printing pattern, respectively, on the substrate 200. That is, the printing patterns of the first printing lines 210 and the second printing lines 220 may be printed left-right symmetrically. This is for symmetrically forming the primary coil and the secondary coil of the transformer that is connected with a differential amplifier 250. Compared with the transformer of the related art illustrated in FIG. 1, it can be seen that the primary coil and the secondary coil have symmetrical shapes in the transformer illustrated in FIG. 2. Accordingly, for a transformer that is connected with a device with performance depending on symmetry such as the symmetrical differential amplifier, the symmetry of the transformer can improve the performance of the transformer.

The first printing lines 210 and the second printing lines 220 may be printed alternately at predetermined distances on the substrate 200. For example, a first printing line 210, a second printing line 220, a first printing line 210, and a second printing line 220 may be sequentially printed in parallel on the substrate 200, in which the first printing lines 210 and the second printing lines 220 do not cross each other. In this case, the numbers of the first printing lines 210 and the second printing lines 220 to be printed on the substrate 200 may depend on setting by a user.

The first printing line 210 and the second printing line 220 each may include coil printing lines 211 and a connection printing line 212. The coil printing lines 211, which are printing lines having a printing pattern in which they are spaced, may be printed on the substrate 200 in the shape of '——' or '/ \'. The pattern with the coil printing lines 211 spaced is for increasing the wound number of coils for the features of a transformer. Compared with the transformer of the related art illustrated in FIG. 1, it can be seen that the transformer illustrated in FIG. 2 has more number of wound coils. The connection printing line 212, which connects the left-right symmetrical coil printing lines 211 to not bonding wires, but printing lines, can reduce the cost by decreasing the number of bonding wires.

The first bonding wires 230 and the second bonding wires 240 form the coils of the transformer using a symmetrical printing pattern of the present invention. The first bonding wire 230 and the second bonding wire 240 are made of a high conductive material such as copper (Cu), silver (Ag), or white gold (Pt) and they are components of coils while connecting respectively the first printing lines 210 and the second printing lines 220 which are spaced, respectively. In this case, since the first printing lines 210 and the second printing lines 220 are printed symmetrically, respectively, the bonding wires connecting them also have left-right symmetry. Accordingly, the first printing lines 210 and the first bonding wires 230 form the primary coil of the transformer and the second printing line 220 and the second bonding wires 240 form the secondary coil of the transformer. Further, the numbers of the first bonding wires 230 and the second bonding wires 240 may depend on setting the numbers of the first printing lines 210 and the second printing lines 220.

In detail, the primary input electrode $1^{st}_{in}$ and a coil printing line 211 of the first printing line 210 which are connected with the symmetrical differential amplifier 250, the coil printing line 211 close to the coil printing line 211, the connection printing line 212 for the first coil printing line 211 and the first printing line 210, and the primary output electrode $1^{st}_{out}$ connected with the coil printing line 211 and the symmetrical differential amplifier 250 are connected to a plurality of first bonding wires, thereby forming the primary coil of the transformer. Meanwhile, the secondary input electrode $2^{st}_{in}$ and the coil printing line 211 of the second printing line 220 which are connected with a terminal of a load, the coil printing line 211 close to the coil printing line 211, the connection printing line 212 for the coil printing line 211 and the second printing line 220, and the secondary output electrode $2^{st}_{in}$ connected with the coil printing line 211 and another terminal of the load are connected to a plurality of second bonding wires 240, thereby forming the secondary coil of the transformer.

Figure 3:
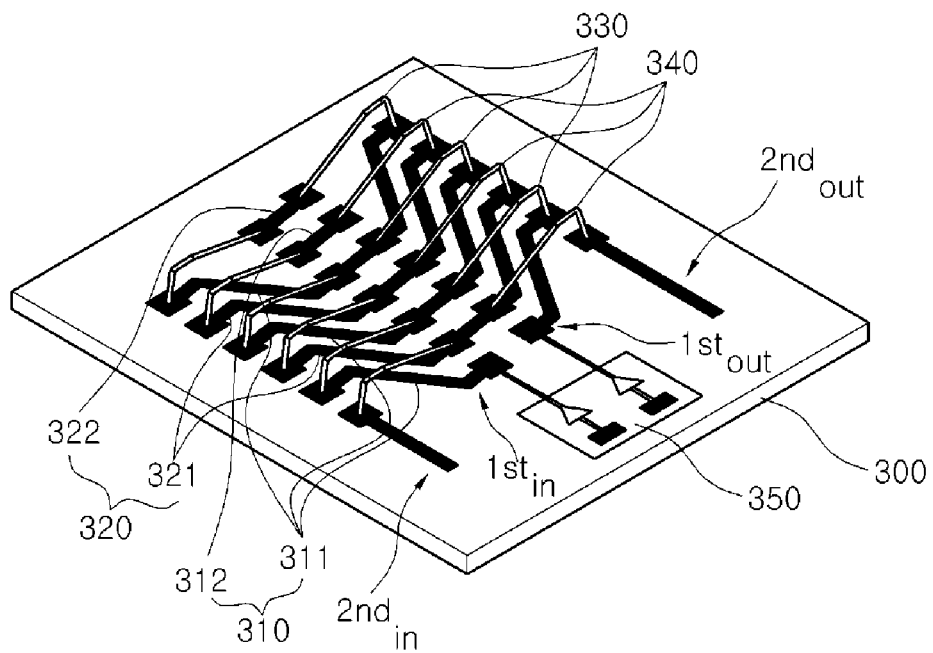
FIGS. 3 and 4 are views illustrating the configuration of transformers using a symmetrical printing pattern according to other embodiment of the present invention.
Figure 4:
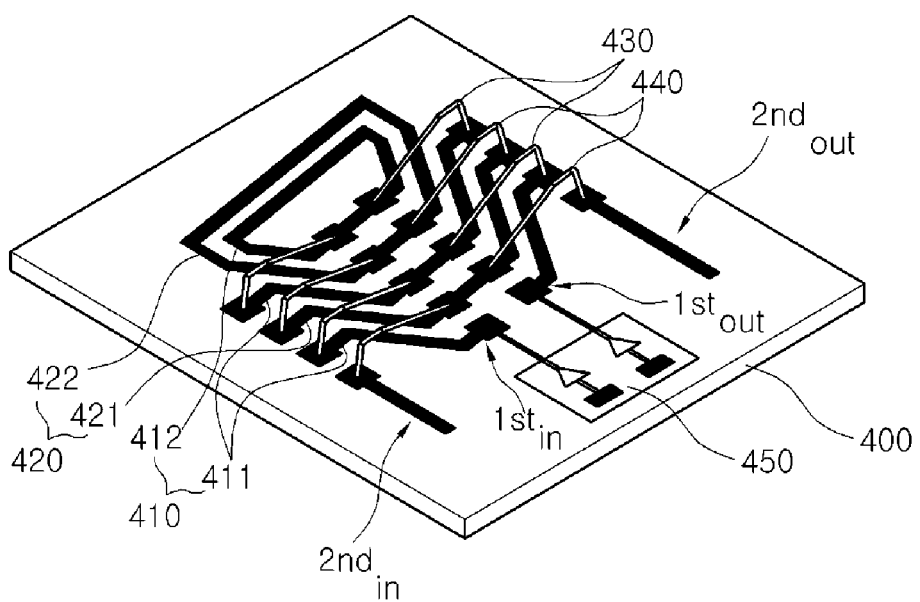

FIGS. 3 and 4 are views illustrating the configuration of transformers using a symmetrical printing pattern according to other embodiment of the present invention.

Referring to FIG. 3, the transformer illustrated in FIG. 3, similar to the transformer illustrated in FIG. 2, includes a substrate 300, first printing lines 310, second printing lines 320, first bonding wires 330, and second bonding wires 340. The first printing lines 310 and the first bonding wires 330 form the primary coil of the transformer which is connected with a symmetrical differential amplifier 350, while the second printing lines 320 and the second bonding wires 340 form the secondary coil of the transformer. In this case, the first printing line 310 and the second printing line 320 each include coil printing lines 311 and 321 having a symmetrical pattern of the shape of '/ \' and connection printing lines 312 and 322 formed in the shape of '—'. The connection lines 312 and 322 are smaller in length than the connection lines 212 and 222 illustrated in FIG. 2 and disposed between the coil printing lines 311 and 321, such that the whole first bonding wires 330 and second bonding wires 340 are formed left-right symmetrically in parallel with each other, respectively.

Referring to FIG. 4, the transformer illustrated in FIG. 4, similar to the transformers illustrated in FIGS. 2 and 3, includes a substrate 400, first printing lines 410, second printing lines 420, first bonding wires 430, and second bonding wires 440. The first printing lines 410 and the first bonding wires 430 form the primary coil of the transformer which is connected with a symmetrical differential amplifier 450, while the second printing lines 420 and the second bonding wires 440 form the secondary coil of the transformer. In this case, the first printing line 410 and the second printing line 420 each include coil printing lines 411 and 421 having a symmetrical pattern of the shape of '/\' and connection printing lines 412 and 422 formed in the shape of '['. The connection printing lines 412 and 422 formed in a loop, respectively, unlike the transformer illustrated in FIG. 2 or 3, so the entire lengths of the coils are large.

Figure 5:
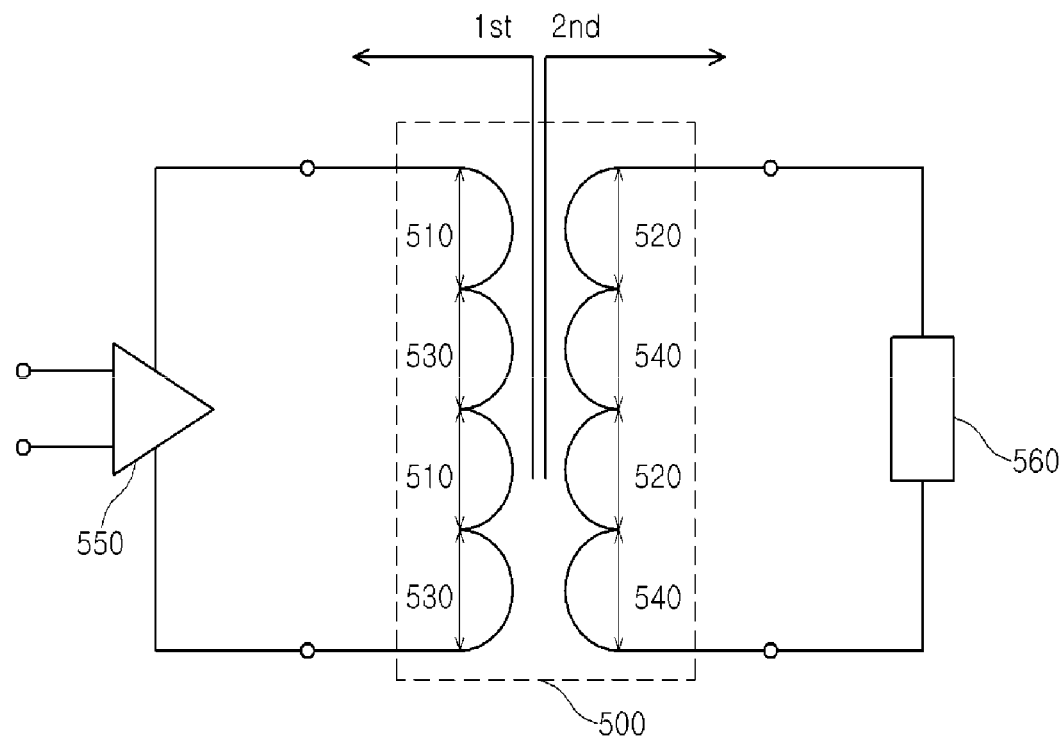
FIG. 5 is an equivalent circuit diagram of the transformers using a symmetrical printing pattern which are illustrated in FIGS. 2 to 4.

FIG. 5 is an equivalent circuit diagram of the transformers using a symmetrical printing pattern which are illustrated in FIGS. 2 to 4.

Referring to FIG. 5, a symmetrical transformer 500 includes a primary coil 510 and 530 connected to both ends of a symmetrical differential amplifier 550 and a secondary coil 520 and 540 connected to both ends of a load 560, in which the coils are formed by printing lines 510 and 520 and bonding wires 530 and 540 which are alternately arranged, respectively. In this case, the first primary coil and the secondary coil have symmetry and the primary input/output terminals and the secondary input/output terminals are close to each other, respectively, such that it is possible to achieve the symmetrical transformer 500 having high performance and reducing the size and volume of a chip which is sensitive to a design area such as an integrated circuit.

According to a transformer using a symmetrical printing pattern of the present invention, since a transformer that is connected to a symmetrical integrated circuit is implemented, using a symmetrical printing pattern, it is possible to prevent deterioration of performance of a symmetrical device that is connected with the transformer and it is also possible to reduce the cost for connecting additional printing lines or bonding wires by concentrating the positions of the input/output terminals.

Although the present invention has been described through the embodiments with reference to the drawings, but the present invention is not limited thereto. Therefore, the present invention should be construed on the basis of claims intended for including modifications that can be achieved apparently from the embodiments.

The invention claimed is:

1. A transformer using a symmetrical printing pattern, comprising:
   a substrate;
   a plurality of first printing lines printed at predetermined distances on the substrate;
   a plurality of second printing lines printed at predetermined distances on the substrate;
   first bonding wires connecting the first printing lines; and
   second bonding wires connecting the second printing lines,
   wherein the first printing lines and the second printing lines are printed in a symmetrical printing pattern, respectively, on the substrate, and the first bonding wires and the second bonding wires are formed symmetrically, respectively,
   wherein the first printing line and the second printing line each include coil printing lines and a connection printing line.

2. The transformer of claim 1, wherein the first printing lines and the first bonding wires form a primary coil of the transformer, and the second printing lines and the second bonding wires form a secondary coil of the transformer.

3. The transformer of claim 1, wherein the first printing lines and the second printing lines are alternately printed at predetermined distances on the substrate.

4. The transformer of claim 1, wherein the coil printing lines are printed in the shape of '— —' or '/\' on the substrate.

5. The transformer of claim 1, wherein the connection printing line is printed in the same length and in the same direction as the coil printing lines on the substrate.

6. The transformer of claim 1, wherein the connection printing line is printed shorter than the coil printing lines on the substrate.

7. The transformer of claim 1, wherein the connection printing line is printed longer than the coil printing lines on the substrate.

8. The transformer of claim 7, wherein the connection printing line is printed in a loop on the substrate.

* * * * *